United States Patent
Xue et al.

(10) Patent No.: US 12,451,626 B2
(45) Date of Patent: Oct. 21, 2025

(54) CONNECTION ASSEMBLY FOR ANTENNA AND BASE STATION ANTENNA

(71) Applicant: Outdoor Wireless Networks LLC, Claremont, NC (US)

(72) Inventors: Cheng Xue, Suzhou (CN); Bo Wu, Richardson, TX (US); Fei Li, Suzhou (CN); Jian Zhang, Suzhou (CN); Yuanpeng Ren, Suzhou (CN); Changfu Chen, Suzhou (CN); Xun Zhang, Suzhou (CN)

(73) Assignee: OUTDOOR WIRELESS NETWORKS LLC, Richardson, TX (US)

( * ) Notice: Subject to any disclaimer, the term of this patent is extended or adjusted under 35 U.S.C. 154(b) by 592 days.

(21) Appl. No.: 17/879,962

(22) Filed: Aug. 3, 2022

(65) Prior Publication Data
US 2023/0064306 A1 Mar. 2, 2023

(30) Foreign Application Priority Data

Aug. 27, 2021 (CN) .......................... 202110992014.6
Nov. 30, 2021 (CN) .......................... 202111437223.0

(51) Int. Cl.
*H01P 3/02* (2006.01)
*H01Q 1/48* (2006.01)
(Continued)

(52) U.S. Cl.
CPC ............. *H01R 12/53* (2013.01); *H01P 3/026* (2013.01); *H01Q 1/48* (2013.01); *H05K 1/0243* (2013.01);
(Continued)

(58) Field of Classification Search
CPC ...... H05K 1/0243; H05K 1/111; H05K 1/115; H05K 2201/10098; H05K 2201/10189;
(Continued)

(56) References Cited

U.S. PATENT DOCUMENTS 6,007,347 A    12/1999   Keldsen et al.
8,932,078 B1 *  1/2015   Martin .................... H01R 24/50
                                                 439/574
(Continued)

FOREIGN PATENT DOCUMENTS

EP    1341254 A2    9/2003
GB    2171257 A     8/1986
WO    2017165512 A1 9/2017

OTHER PUBLICATIONS

"International Search Report and Written Opinion for International Application No. PCTUS22039281 dated Jan. 12, 2023, 19 pages".

*Primary Examiner* — Andrea Lindgren Baltzell
*Assistant Examiner* — Kimberly E Glenn
(74) *Attorney, Agent, or Firm* — Myers Bigel, P.A.

(57) ABSTRACT

A connection assembly for an antenna includes a printed circuit board and a coaxial cable connected to the printed circuit board. A transmission trace and a solder pad are provided on the printed circuit board. An opening for receiving an end portion of the coaxial cable is also provided in the printed circuit board, and an exposed outer conductor of the end portion extends into the opening, and an exposed inner conductor reaches the solder pad. The connection assembly further includes a ground structure, which is electrically connected to a ground metal layer on a second surface of the printed circuit board, and the ground structure is at least partially arranged on both sides of the exposed inner conductor and/or the exposed outer conductor.

20 Claims, 13 Drawing Sheets

(51) Int. Cl.
   *H01R 12/53*      (2011.01)
   *H05K 1/02*       (2006.01)
   *H05K 1/11*       (2006.01)

(52) U.S. Cl.
   CPC .............. *H05K 1/111* (2013.01); *H05K 1/115* (2013.01); *H05K 2201/10098* (2013.01); *H05K 2201/10189* (2013.01)

(58) Field of Classification Search
   CPC ................ H05K 1/0219; H05K 1/113; H05K 2201/09063; H05K 2201/09254; H05K 2201/09618; H05K 2201/10356; H05K 3/3405; H01R 12/53; H01R 9/0515; H01P 3/026; H01P 5/085; H01Q 1/48
   See application file for complete search history.

(56) References Cited

U.S. PATENT DOCUMENTS

| | | | |
|---|---|---|---|
| 9,136,655 B2* | 9/2015 | Moon | H01R 12/515 |
| 9,871,307 B2* | 1/2018 | Le Cam | H01P 5/085 |
| 2003/0042041 A1 | 3/2003 | Song et al. | |

* cited by examiner

CONNECTION ASSEMBLY FOR ANTENNA AND BASE STATION ANTENNA

CROSS-REFERENCE TO RELATED APPLICATIONS

The present application claims priority to Chinese Patent Application No. 202110992014.6, filed Aug. 27, 2021, and to Chinese Patent Application No. 202111437223.0, filed Nov. 30, 2021, the entire content of each of which is incorporated herein by reference as if set forth fully herein.

FIELD

The present disclosure relates to a communication system, and more specifically, to a connection assembly for an antenna and a base station antenna including the connection assembly.

BACKGROUND

Coaxial cables are widely used in antenna systems as radio frequency transmission lines. FIG. 1 is a schematic perspective view of a conventional connection assembly for connecting a coaxial cable 1 to a printed circuit board 2. As shown in FIG. 1, the coaxial cable 1 extends parallel to the printed circuit board 2. An insulating cable jacket 3 is stripped off one end of the coaxial cable 1 to expose an outer conductor 4. The exposed outer conductor 4 is soldered to an outer conductor pad 5 provided on one side of the printed circuit board 2. The outer conductor pad 5 is electrically connected to a ground metal layer (such as a ground copper layer) of the printed circuit board 2, so that the outer conductor 4 of the coaxial cable 1 is electrically connected to the ground copper layer of the printed circuit board 2 so that the outer conductor 4 is grounded.

An outer segment of the exposed outer conductor 4 is stripped off together with an insulating dielectric layer that is between the outer conductor 4 and an inner conductor 6 so as to expose the inner conductor 6. A via hole 7 is provided immediately adjacent the outer conductor pad 5, and the inner conductor 6 of the coaxial cable 1 is bent and passed through the via hole 7 in a direction perpendicular to the printed circuit board 2. The inner conductor 6 is soldered to a transmission trace on the other side of the printed circuit board 2. In this way, electrical connection between the coaxial cable 1 and the printed circuit board 2 is achieved.

The above-described technique for connecting the coaxial cable 1 to the printed circuit board 2 has several disadvantages. First, the inner conductor 6 of the coaxial cable 1 is exposed to the ambient. Since the coaxial cable is used to transmit radio frequency signals, which tend to radiate energy, the energy loss associated with the exposed inner conductor 6 may be significant. Second, the bent portion of the inner conductor 6 may generate a parasitic inductance, which may make it more difficult to achieve a good impedance match between the coaxial cable 1 and the printed circuit board 2, and hence may increase the return loss. The influence of the parasitic inductance may become particularly significant when the system operates in a high frequency band.

Therefore, the radio frequency performance of the radio frequency signals transmitted between the coaxial cable and the printed circuit board is worthy of improvement. In addition, the assembly method between the coaxial cable and the printed circuit board also needs to be improved.

In addition to radio frequency transition between a coaxial cable and a printed circuit board, the performance of radio frequency transition between a printed circuit board, for example, a feeder panel, and a feed stalk of a radiating element is also important. Good radio frequency transition is conducive to good radio frequency performance, for example, return loss, insertion loss and isolation of an antenna. As base station antennas operate in higher radio frequency operating bands, for example at 3-6 GHz, the performance of the radio frequency transition becomes increasingly important. Therefore, the radio frequency performance of radio frequency signals transmitted between a feeder panel and a feed stalk of a radiating element is worth improving.

SUMMARY

According to a first aspect of the present disclosure, a connection assembly for an antenna is provided. The connection assembly including a printed circuit board and a coaxial cable connected to the printed circuit board, wherein a transmission trace is provided on a first surface of the printed circuit board, and a solder pad for electrically connecting the transmission trace is provided on the printed circuit board; an opening for receiving an end portion of the coaxial cable is provided in the printed circuit board, wherein an exposed outer conductor of the end portion partially or completely extends in the opening, and an exposed inner conductor of the end portion that extends from the exposed outer conductor is soldered to the solder pad and is electrically connected to the transmission trace; the connection assembly further includes a ground structure, which is electrically connected to a ground metal layer on a second surface of the printed circuit board, wherein the ground structure is at least partially arranged on both sides of the exposed inner conductor and/or the exposed outer conductor.

In this way, the assembly structure of the connection assembly in the antenna is effectively improved, and at the same time, the radio frequency performance of radio frequency signals at the time when the radio frequency signals are transitioned from the coaxial cable to a microstrip line is improved.

In some embodiments, the ground structure includes a metal pattern area provided on the first surface of the printed circuit board.

In some embodiments, the metal pattern area includes a first section arranged on both sides of the exposed inner conductor and a second section arranged on both sides of the exposed outer conductor.

In some embodiments, the ground structure includes a metal pattern area and a ground connector, and the ground structure is soldered to the metal pattern area to form the ground structure together with the metal pattern area.

In some embodiments, the ground connector may include an outer conductor joint portion and a ground joint portion. The outer conductor joint portion is configured to be soldered to the exposed outer conductor of the end portion of the coaxial cable. The ground joint portion is configured to be soldered to the metal pattern area.

In some embodiments, the end portion of the coaxial cable extends in the opening in an orientation at an angle of less than 30°, 20°, 10° or 5° with the printed circuit board.

In some embodiments, the end portion of the coaxial cable extends in the opening parallel to the printed circuit board.

In some embodiments, the connection assembly includes a printed circuit board and a plurality of coaxial cables connected to the printed circuit board, a plurality of openings are provided on the printed circuit board, and each opening is configured to receive a corresponding coaxial cable.

According to a second aspect of the present disclosure, a base station including the connection assembly according to each embodiment of the present disclosure is provided.

According to a third aspect of the present disclosure, a connection assembly for antenna is provided, where the connection assembly includes a printed circuit board and a radiating element connected to the printed circuit board, where the radiating element includes a feed stalk and a radiator mounted on the feed stalk and the radiating element is mounted on the printed circuit board through the feed stalk, wherein a transmission trace is provided on a first surface of the printed circuit board, and a soldering area for electrically connecting the transmission trace to the feed stalk is provided on the printed circuit board, an opening for receiving the feed stalk of the radiating element is provided on the printed circuit board, where the feed stalk is extends through the opening from the first surface of the printed circuit board to extend past the second surface of the printed circuit board, and a feed line is provided on the feed stalk, where the feed line is configured to be soldered to the soldering area in order to be electrically connected to the transmission trace, and the connection assembly further includes a ground structure, which is electrically connected to a ground metal layer on the second surface of the printed circuit board, in which, the ground structure is at least partially arranged on two sides of the transmission trace.

Figure 1:
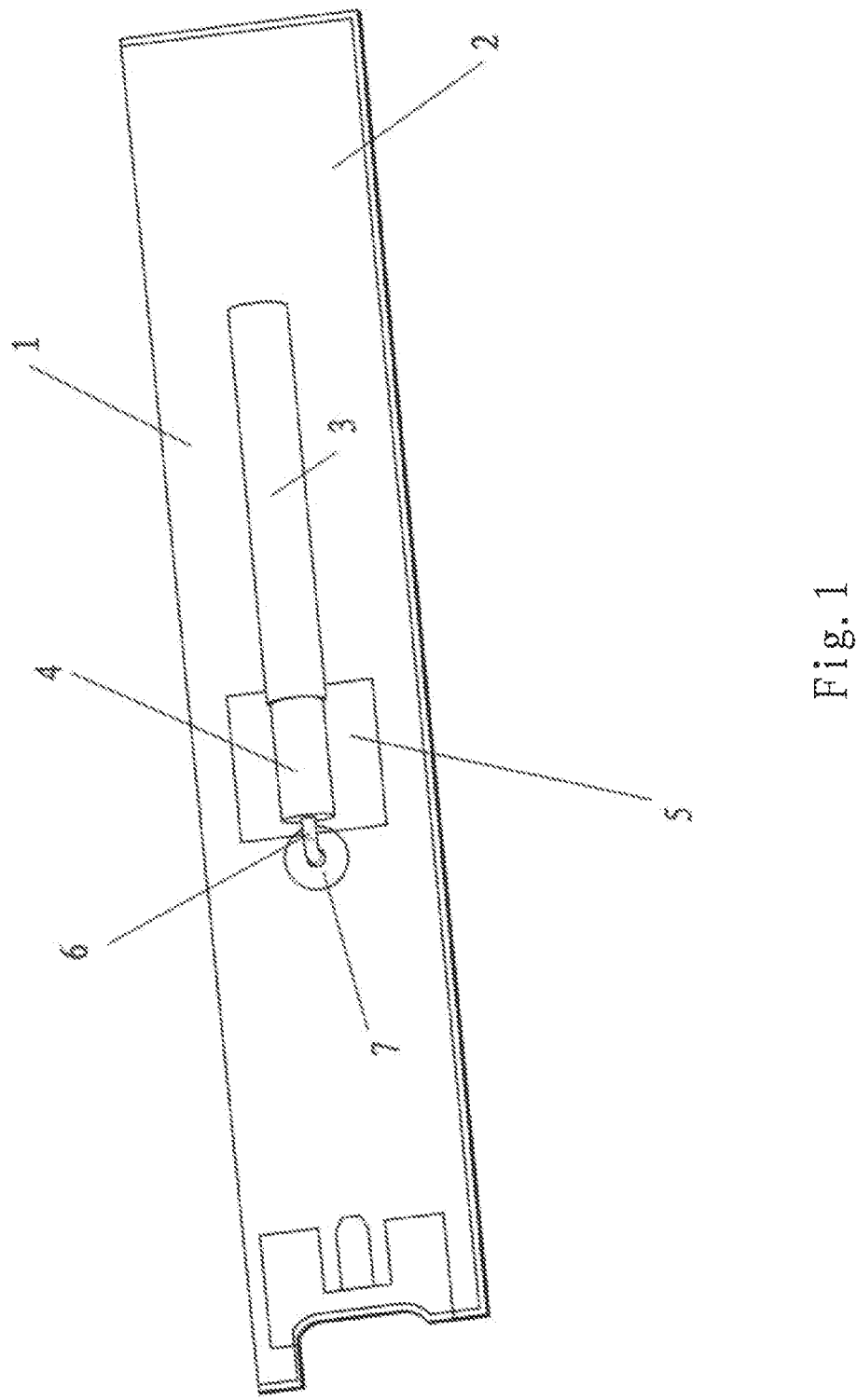
FIG. 1 is a schematic perspective view of a conventional connection assembly for connecting a coaxial cable to a printed circuit board.

Note that, in some cases the same elements or elements having similar functions are denoted by the same reference numerals in different drawings, and description of such elements is not repeated. In some cases, similar reference numerals and letters are used to refer to similar elements, and thus once an element is defined in one figure, it need not be further discussed in subsequent figures.

In order to facilitate understanding, the position, size, range, or the like of each structure illustrated in the drawings may not be drawn to scale. Thus, the invention is not necessarily limited to the position, size, range, or the like as disclosed in the drawings.

DETAILED DESCRIPTION

The present invention will be described with reference to the accompanying drawings, which show a number of example embodiments thereof. It should be understood, however, that the present invention can be embodied in many different ways, and is not limited to the embodiments described below. Rather, the embodiments described below are intended to make the invention of the present invention more complete and fully convey the scope of the present invention to those skilled in the art. It should also be understood that the embodiments disclosed herein can be combined in any way to provide many additional embodiments.

The terminology used herein is for the purpose of describing particular embodiments, but is not intended to limit the scope of the present invention. All terms (including technical terms and scientific terms) used herein have meanings commonly understood by those skilled in the art unless otherwise defined. For the sake of brevity and/or clarity, well-known functions or structures may be not described in detail.

Herein, when an element is described as located "on" "attached" to, "connected" to, "coupled" to or "in contact with" another element, etc., the element can be directly located on, attached to, connected to, coupled to or in contact with the other element, or there may be one or more intervening elements present. In contrast, when an element is described as "directly" located "on", "directly attached" to, "directly connected" to, "directly coupled" to or "in direct contact with" another element, there are no intervening elements present. In the description, references that a first element is arranged "adjacent" a second element can mean that the first element has a part that overlaps the second element or a part that is located above or below the second element.

Herein, the foregoing description may refer to elements or nodes or features being "connected" or "coupled" together. As used herein, unless expressly stated otherwise, "connected" means that one element/node/feature is electrically, mechanically, logically or otherwise directly joined to (or directly communicates with) another element/node/feature. Likewise, unless expressly stated otherwise, "coupled" means that one element/node/feature may be mechanically, electrically, logically or otherwise joined to another element/node/feature in either a direct or indirect manner to permit interaction even though the two features may not be directly connected. That is, "coupled" is intended to encompass both direct and indirect joining of elements or other features, including connection with one or more intervening elements.

Herein, terms such as "upper", "lower", "left", "right", "front", "rear", "high", "low" may be used to describe the spatial relationship between different elements as they are shown in the drawings. It should be understood that in addition to orientations shown in the drawings, the above terms may also encompass different orientations of the device during use or operation. For example, when the device in the drawings is inverted, a first feature that was described as being "below" a second feature can be then described as being "above" the second feature. The device may be oriented otherwise (rotated 90 degrees or at other orientation), and the relative spatial relationship between the features will be correspondingly interpreted.

Herein, the term "A or B" used through the specification refers to "A and B" and "A or B" rather than meaning that A and B are exclusive, unless otherwise specified.

The term "exemplary", as used herein, means "serving as an example, instance, or illustration", rather than as a "model" that would be exactly duplicated. Any implementation described herein as exemplary is not necessarily to be construed as preferred or advantageous over other implementations. Furthermore, there is no intention to be bound by any expressed or implied theory presented in the detailed description.

Herein, the term "substantially", is intended to encompass any slight variations due to design or manufacturing imperfections, device or component tolerances, environmental effects and/or other factors. The term "substantially" also allows for variation from a perfect or ideal case due to parasitic effects, noise, and other practical considerations that may be present in an actual implementation.

Herein, certain terminology, such as the terms "first", "second" and the like, may also be used in the following description for the purpose of reference only, and thus are not intended to be limiting. For example, the terms "first", "second" and other such numerical terms referring to structures or elements do not imply a sequence or order unless clearly indicated by the context.

Further, it should be noted that, the terms "comprise", "include", "have" and any other variants, as used herein, specify the presence of stated features, steps, operations, elements, and/or components, but do not preclude the presence or addition of one or more other features, steps, operations, elements, components, and/or groups thereof.

Connection assemblies 100, 100' to which the present disclosure relates may include printed circuit boards 10, 10' and one or more coaxial cables 20, 20' connected to the printed circuit boards 10, 10'. Connection assemblies are widely used in base station antennas to achieve the transmission of RF signals between different functional devices of the base station antenna. In some embodiments, the printed circuit boards 10, 10' may be feed boards, and the coaxial cables 20, 20' may, for example, be bridged between the feed board and a phase shifter or a calibration board so as to transmit RF signals therebetween. The printed circuit boards 10, 10' may be provided with transmission traces 13, 13' and solder pads 14, such as pads, for electrically connecting the transmission traces 13, 13'. Exposed inner conductors 22, 22' of the end portions of the coaxial cables 20, 20' may reach the solder pads 14, and be soldered to the solder pads 14, thereby achieving the electrical connection between the inner conductors 22, 22' of the coaxial cables 20, 20' and the transmission traces 13, 13'. In some embodiments, the printed circuit boards 10, 10' may be calibration boards, and the coaxial cables 20, 20' may, for example, be bridged between the calibration board and the feed board so as to transmit RF signals therebetween. It should be understood that the printed circuit boards 10, 10' may be any other circuit boards in the base station antenna, for example, a filter circuit board or a phase shift circuit board, etc.

Next, with reference to FIGS. 2 to 12, specific design schemes of the connection assembly 100 according to some embodiments of the present disclosure will be described in detail.

Figure 2:
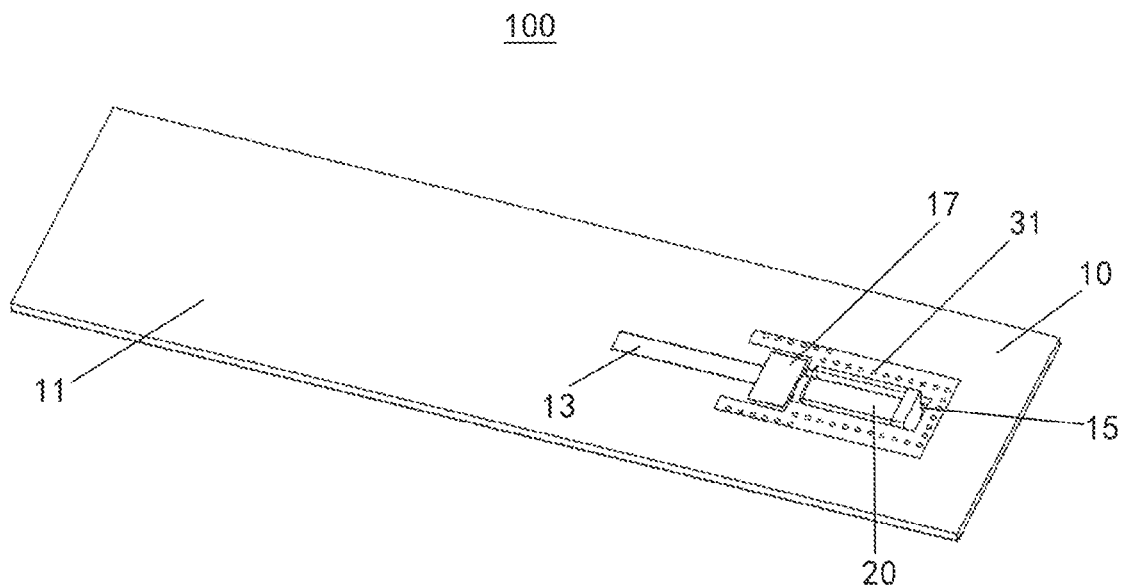
FIG. 2 is a schematic top perspective view of a connection assembly according to a first embodiment of the present disclosure.
Figure 3:
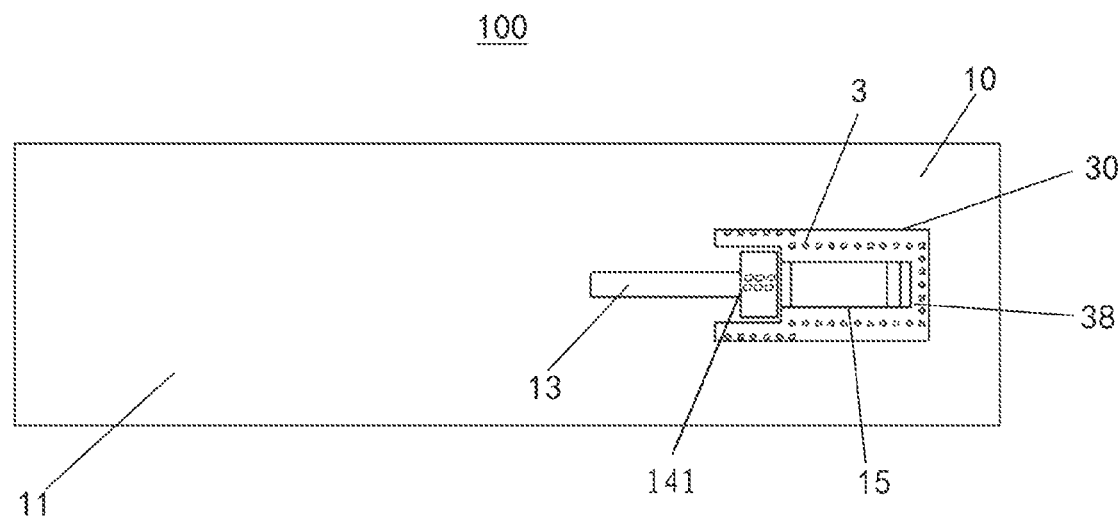
FIG. 3 is a schematic top view of the connection assembly of FIG. 2.
Figure 4:
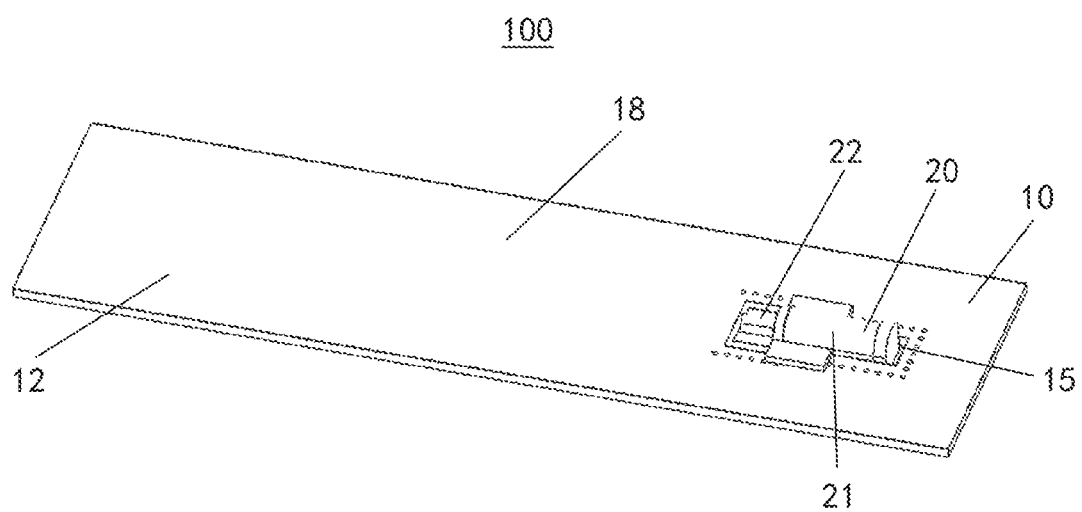
FIG. 4 is a schematic bottom perspective view of the connection assembly of FIG. 2.

The connection assembly 100 according to a first embodiment of the present disclosure will be described in detail with reference to FIGS. 2 to 5. FIG. 2 is a schematic top perspective view of the connection assembly 100; FIG. 3 is a schematic top view of the connection assembly 100; FIG. 4 is a schematic bottom perspective view of the connection assembly 100; and FIG. 5 is a schematic bottom view of the connection assembly 100.

In the connection assembly 100 according to the first embodiment of the present disclosure, a transmission trace 13 is provided or printed on the first surface 11 of the printed circuit board 10. A solder pad 14, such as a conductive pad, for electrically connecting the transmission trace 13 may be provided on the second surface 12 opposite to the first surface 11, and the solder pad 14 may be electrically connected to the transmission trace 13 via one or more via holes. In each figure, only one straight transmission trace 13 is schematically shown. However, it should be understood that the shape of the transmission trace 13 may be arbitrary, and the number and arrangement of the transmission trace(s) 13 may be flexible.

An opening 15 for receiving an end portion of the coaxial cable 20 may be provided in the printed circuit board 10. The opening 15 may be a region where the printed circuit board material is cut away and removed. The end portion of the coaxial cable 20 may include an exposed outer conductor 21 and an exposed inner conductor 22 extending from the exposed outer conductor 21. Additionally, the end portion of the coaxial cable 20 may further include a small and complete section of the coaxial cable 20, that is, a section of the coaxial cable 20 in which the jacket is not removed. The coaxial cable 20 may extend to the opening 15 in an orientation at an angle of less than 20°, 15° or 10° with the printed circuit board 10. In other words, the end portion of the coaxial cable 20 may extend in the opening 15 substantially parallel to the printed circuit board 10 and further be connected to the printed circuit board 10. In this way, a connection assembly 100 with low profile and high space utilization rate is achieved.

Figure 5:
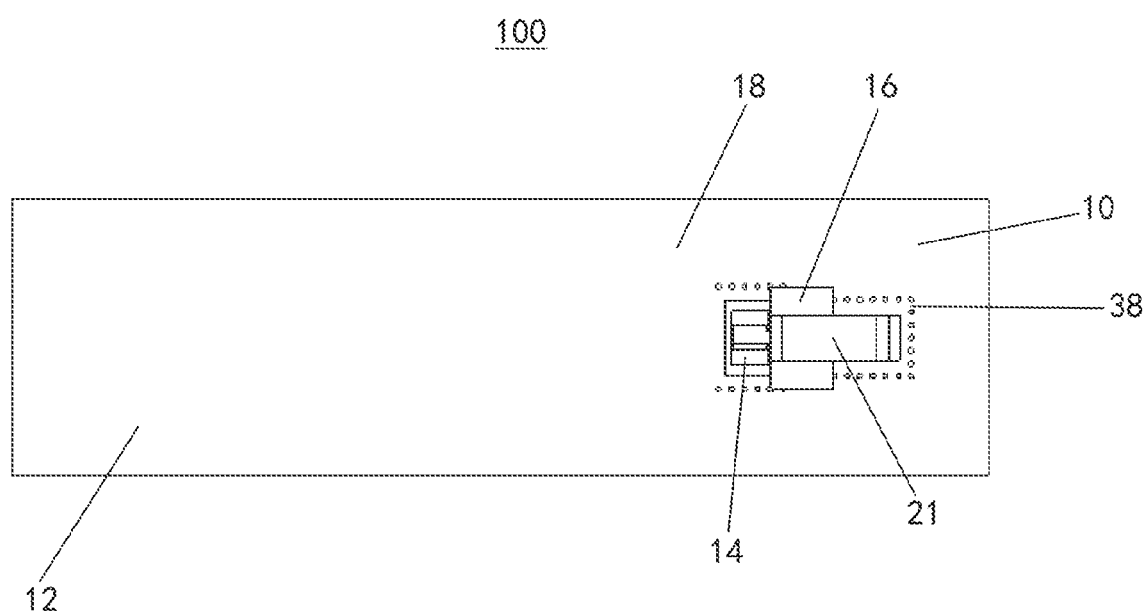
FIG. 5 is a schematic bottom view of the connection assembly of FIG. 2.

Referring to FIGS. 4 and 5, the exposed outer conductor 21 of the end portion may partially or completely extend in the opening 15, and the exposed outer conductor 21 may be soldered to a ground pad 16 electrically connected to a ground metal layer 18 through solder, thereby achieving a common ground connection. The ground pad 16 is a pair of pads that are on the respective two sides of the openings. The exposed inner conductor 22 extending from the exposed outer conductor 21 may extend substantially in parallel to the solder pad 14 on the second surface 12 of the printed circuit board 10 so as to be soldered to the solder pad 14. The solder pad 14 may be electrically connected to the transmission trace 13 on the first surface 11 of the printed circuit board 10 via a via hole. Additionally or alternatively, an impedance matching portion 17 may be provided on the first surface 11 and/or the second surface 12 of the printed circuit board 10. The impedance matching portion 17 may be configured as a metal pattern region connected to the transmission trace 13, and its shape, length and/or width may be varied according to actual application scenarios, in order to adjust the impedance to achieve good impedance matching. The impedance matching portion 17 may be electrically connected to the solder pad 14 by means of via holes, so as to improve the RF transmission performance of the RF signals between the coaxial cable 20 and the transmission trace 13 on the printed circuit board 10, for example, to reduce the return loss.

The connection assembly 100 may have a ground structure 30, and the ground structure 30 may be electrically connected to the ground metal layer 18 on the second surface 12 of the printed circuit board 10. The ground structure 30 may be partially arranged on both sides of the exposed inner conductor 22 and/or the exposed outer conductor 21 so as to at least partially reduce the radiation of radio frequency signals to the ambient when the radio frequency signals are transmitted from the coaxial cable 20 to the transmission trace 13 on the printed circuit board 10. Therefore, the ground structure 30 can make the transition of the RF signal from the coaxial cable 20 (TEM mode) to the microstrip line (quasi-TEM mode) smoother, and further reduce return loss and spatial radiation loss.

Referring to FIGS. 2 and 3, the ground structure 30 may include a metal pattern area 31 or a ground metal pattern provided on the first surface 11 of the printed circuit board 10. The metal pattern area 31 may extend around the opening 15 in a strip shape. The opening 15 may be configured as an elongated or approximately rectangular opening 15. The metal pattern area 31 may surround the edges of the opening 15 in an approximately U shape, that is, the metal pattern area 31 may be arranged around the edges of the opening 15 on three sides. In other embodiments, the opening 15 may also be configured in other shapes, and thus the metal pattern area 31 may also be arranged around the opening 15 following the shape of the opening 15. In other embodiments, the metal pattern area 31 may also be arranged only on the left and right sides of the opening 15. For example, the ground structure 30 may be arranged on both sides of the solder pad 14 and/or the impedance matching portion 17.

The metal pattern area 31 may be electrically connected to the ground metal layer 18 provided on the second surface 12 of the printed circuit board 10 through via holes, such as a series of via holes 38 arranged in accordance with the shape of the metal pattern area 31, thus achieving the common ground between the metal pattern area 31 and the ground metal layer 18. The metal pattern area 31 may include a first section arranged on both sides of the exposed inner conductor 22. When the metal pattern area 31 is arranged on both sides of the exposed inner conductor 22, a structure similar to a coplanar waveguide can be formed, thereby maintaining a stable TEM mode transmission mode of the RF signals during the transmission from the coaxial cable 20 to the microstrip line. Additionally, or alternatively, the metal pattern area 31 may include a second section arranged on both sides of the exposed outer conductor 21. The second section may be arranged surrounding the entire opening 15 in a U shape or at least partially arranged at the edge of the opening 15 in order to suppress unnecessary and undesired radiation of the RF signals to the ambient.

Figure 6:
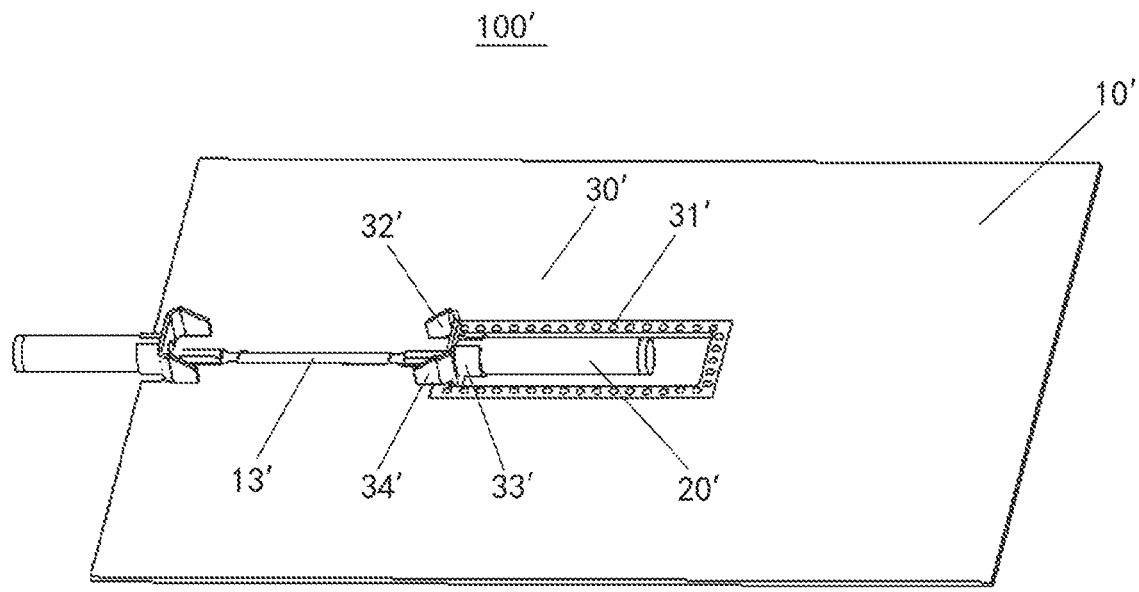
FIG. 6 is a schematic top perspective view of a connection assembly according to a second embodiment of the present disclosure.
Figure 7:
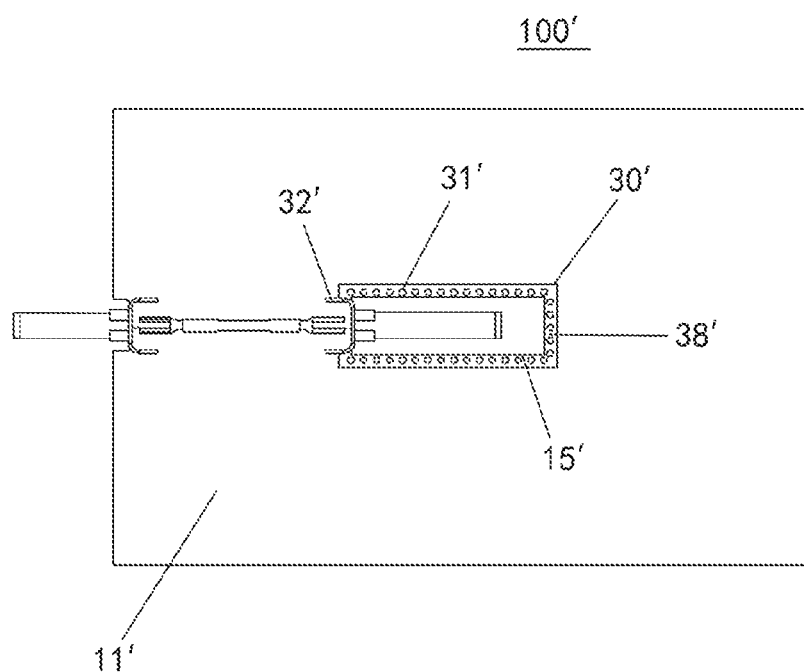
FIG. 7 is a schematic top view of the connection assembly of FIG. 6.
Figure 8:
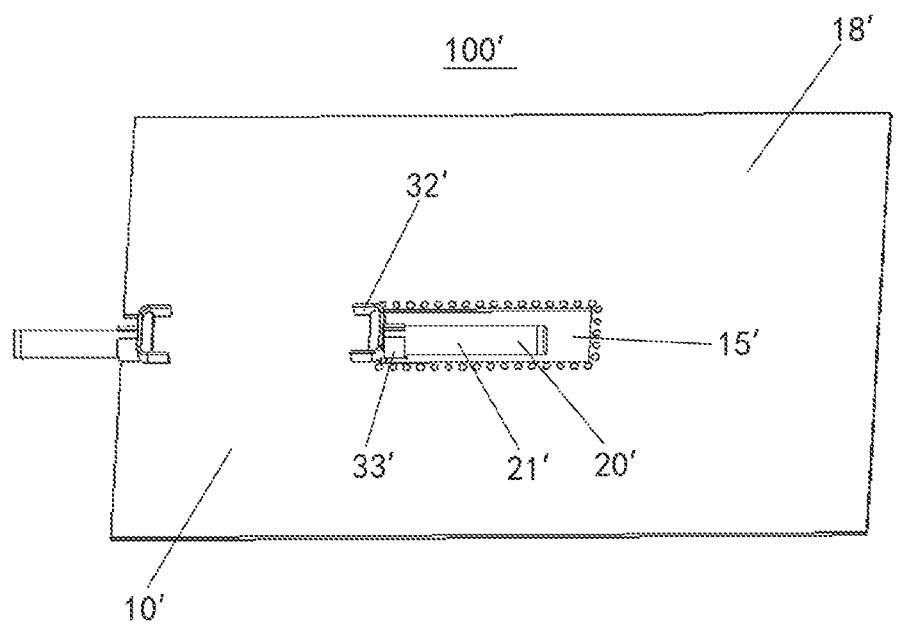
FIG. 8 is a schematic bottom perspective view of the connection assembly of FIG. 6.
Figure 9:
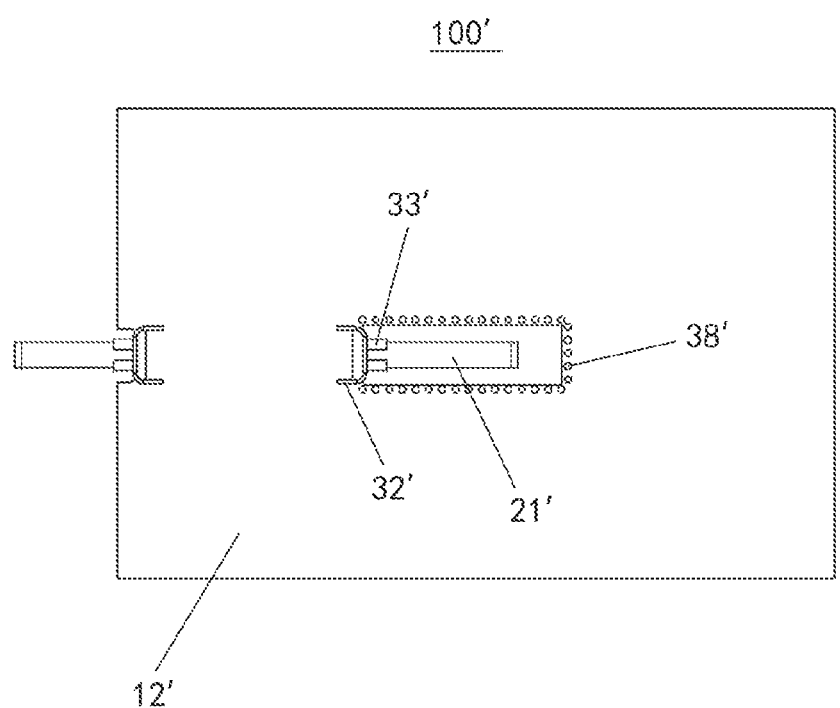
FIG. 9 is a schematic bottom view of the connection assembly of FIG. 6.
Figure 10:
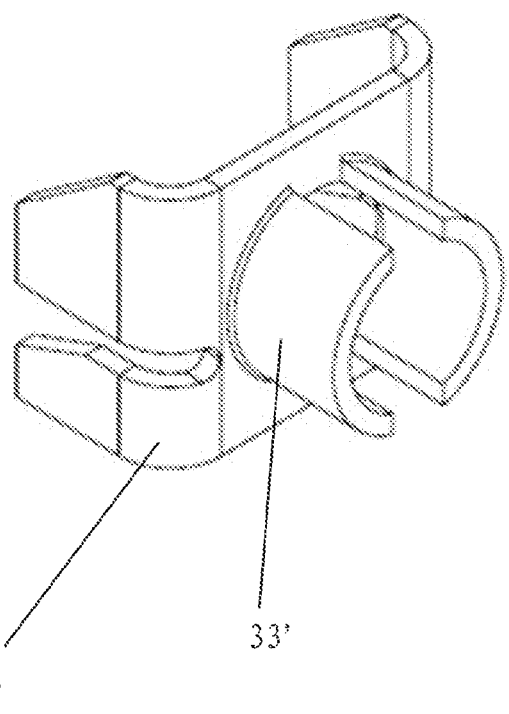
FIG. 10 is a schematic perspective view of the ground connector of the connection assembly of FIG. 6.

A connection assembly 100' according to a second embodiment of the present disclosure will be described in detail with reference to FIGS. 6 to 10. FIG. 6 is a schematic top perspective view of the connection assembly 100' according to the second embodiment of the present disclosure; FIG. 7 is a schematic top view of the connection assembly 100'; FIG. 8 is a schematic bottom view of the connection assembly 100'; and FIG. 9 is a schematic bottom view of the connection assembly 100'. FIG. 10 is a schematic perspective view of the ground connector 32' of the connection assembly 100'.

In the connection assembly 100' according to the second embodiment of the present disclosure, a transmission trace 13' and a solder pad (not shown in the figure) for electrically connecting the transmission trace 13' are provided on the first surface 11' of the printed circuit board 10', and the solder pad may be electrically connected to or integrated with the transmission trace 13'. In each figure, only one straight transmission trace 13' is schematically shown. However, it should be understood that the shape of the transmission trace 13' may be arbitrary, and the number and arrangement of the transmission trace(s) 13' may be flexible.

An opening 15' for receiving an end portion of the coaxial cable 20' may be provided in the printed circuit board 10'. The end portion of the coaxial cable 20' may include an exposed outer conductor 21' and an exposed inner conductor 22' extending from the exposed outer conductor 21'. Additionally, the end portion of the coaxial cable 20' may further include a small and complete section of the coaxial cable 20', that is, a section of the coaxial cable 20' of which jacket is not removed. The coaxial cable 20' may extend to the opening 15' in an orientation at an angle of less than 20°, 15° or 10° with the printed circuit board 10'. In other words, the end portion of the coaxial cable 20' may extend in the opening 15' substantially parallel to the printed circuit board 10' and further be connected to the printed circuit board 10'. In this way, a connection assembly 100' with low profile and high space utilization rate is achieved.

The connection assembly 100' may have a ground structure 30', and the ground structure 30' may be partially arranged on both sides of the exposed inner conductor 22' and/or the exposed outer conductor 21' so as to at least partially reduce the radiation of radio frequency signals to the ambient when the radio frequency signals are transmitted from the coaxial cable 20' to the transmission trace 13' on the printed circuit board 10'. Therefore, the ground structure 30' can make the transition of the RF signal from the coaxial cable 20' (TEM mode) to the microstrip line (quasi-TEM mode) smoother, and further reduce return loss and spatial radiation loss.

Referring to FIGS. 6-9, the ground structure 30' may include a metal pattern area 31' and a ground connector 32' provided on a first (top) surface 11' of the printed circuit board 10'. The ground connector 32' together with the metal pattern area 31 forms the ground structure 30' arranged on both sides of the exposed inner conductor 22' and/or the exposed outer conductor 21'.

The metal pattern area 31' may extend around the opening 15' in a strip shape. The opening 15' may be configured as an elongated or approximately rectangular opening 15'. The metal pattern area 31' may surround the edges of the opening 15' in an approximately U shape, that is, the metal pattern area 31' may be arranged around the edges of the opening 15' on three sides. In other embodiments, the opening 15' may also be configured in other shapes, and thus the metal pattern area 31' may also be arranged around the opening 15' following the shape of the opening 15'. In other embodiments, the metal pattern area 31' may also be arranged only on the left and right sides of the opening 15'. For example, the metal pattern area 31' may be arranged on both sides of the exposed outer conductor 21' so as to suppress unnecessary and undesired radiation of the RF signals to the ambient. The metal pattern area 31' may be electrically connected to the ground metal layer 18' provided on a second (bottom) surface 12' of the printed circuit board 10' through via holes, such as a series of via holes 38' arranged in accordance with the shape of the metal pattern area 31', thus achieving the common ground between the metal pattern area 31' and the ground metal layer 18'.

Referring to FIG. 10, the ground connector 32' may include an outer conductor joint portion 33' and a ground joint portion 34'. The outer conductor joint portion 33' is configured to be soldered to the exposed outer conductor 21' of the end portion of the coaxial cable 20. The ground joint portion 34' is configured to be soldered to the metal pattern area 31' so that the ground connector 32' and the metal pattern area 31' can form a conducting loop. In the illustrated embodiment, a first half of the ground joint portion 34' may be soldered to the metal pattern area 31' on the first surface 11' of the printed circuit board 10', and a second half of the ground joint portion 34' may be soldered to the ground pad electrically connected to the ground metal layer 18' on the second surface 12' of the printed circuit board 10'.

In some embodiments, the ground connector 32' may be configured as a ground clip. The outer conductor joint portion 33' of the ground clip is configured as a hollow tubular portion, which sleeves the exposed outer conductor 21' and is soldered to the exposed outer conductor 21'. The ground joint portion 34' of the ground clip may have a first side wall and a second side wall, which may be respectively arranged on one side of the exposed inner conductor 22'. When the ground connector 32' is arranged on both sides of the exposed inner conductor 22', a structure similar to a coplanar waveguide can be formed, thereby maintaining a stable TEM mode transmission mode of the RF signals during the transmission from the coaxial cable 20' to the microstrip line.

Figure 11:
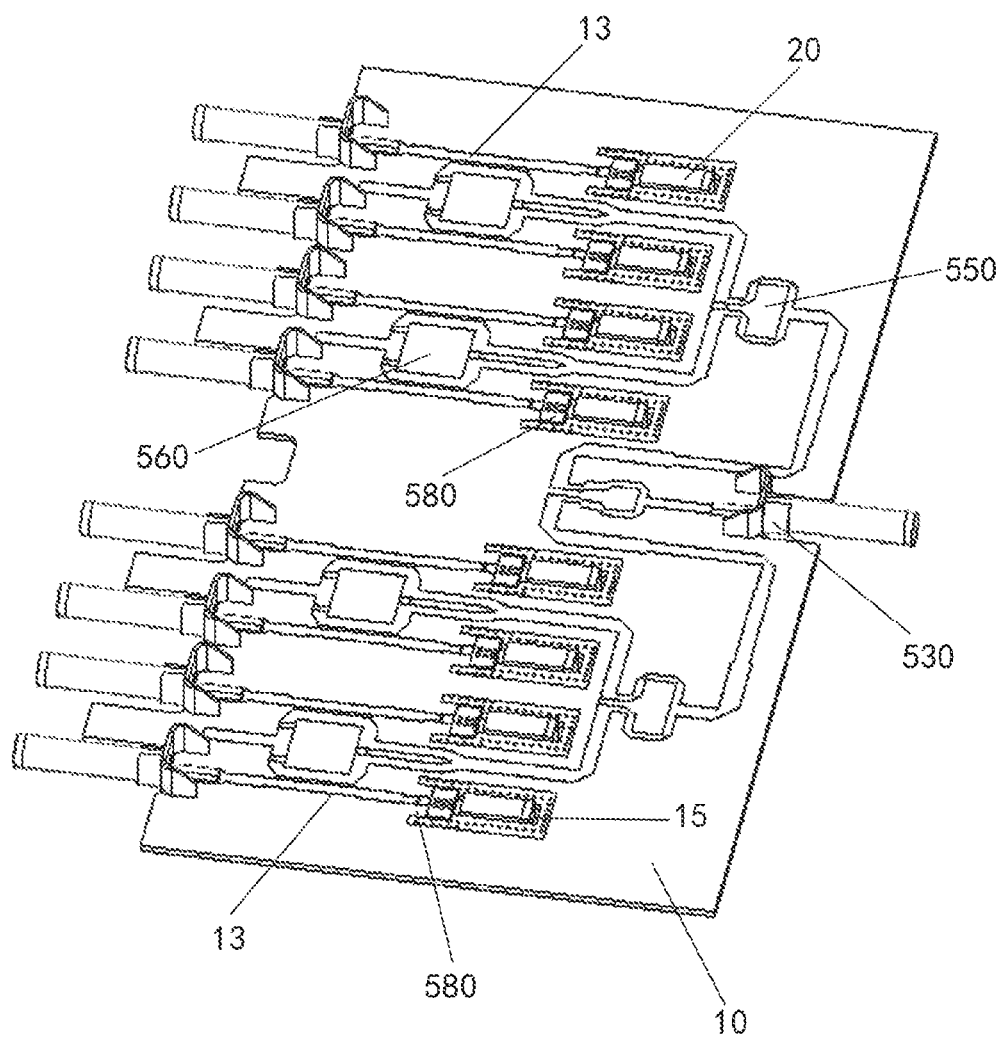
FIG. 11 schematically shows a perspective view of a connection assembly according to some embodiments of the present disclosure, wherein the connection assembly is structured according to the connection assembly of FIG. 2 and the printed circuit board is configured as a calibration board.
Figure 12:
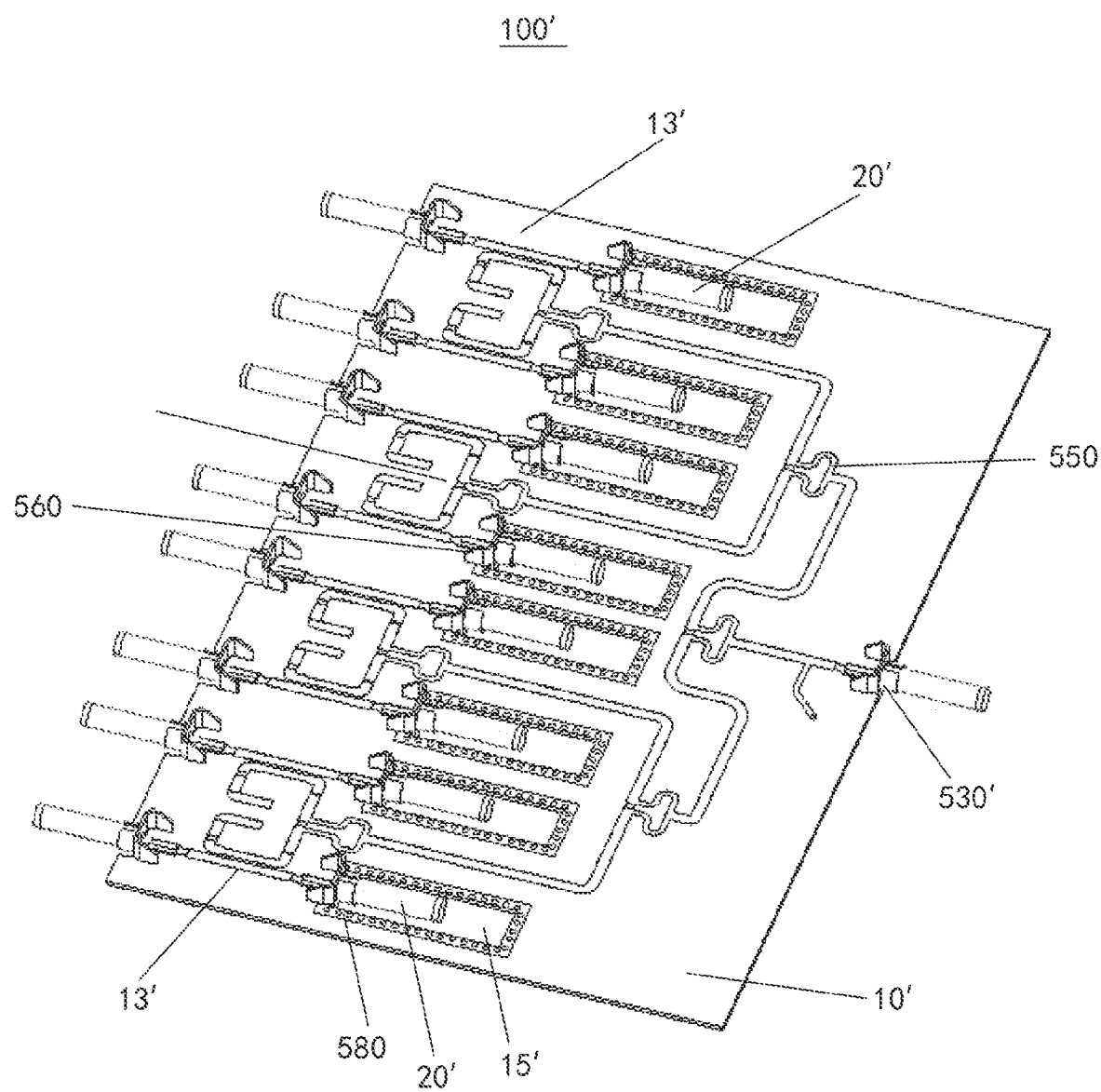
FIG. 12 schematically shows a perspective view of a connection assembly according to some embodiments of the present disclosure, wherein the connection assembly is structured according to the connection assembly of FIG. 6 and the printed circuit board is configured as a calibration board.

Referring to FIGS. 11 and 12, FIG. 11 schematically shows a perspective view of a connection assembly 100 according to some embodiments of the present disclosure, wherein the connection assembly 100 is structured according to the connection assembly 100 of the first embodiment and the printed circuit board 10 is configured as a calibration board; FIG. 12 schematically shows a perspective view of a connection assembly 100' according to some embodiments of the present disclosure, wherein the connection assembly 100' is structured according to the connection assembly 100' of the second embodiment and the printed circuit board 10' is configured as a calibration board.

The calibration board may include, for example: a dielectric substrate, a microstrip calibration circuit provided on a first surface of the dielectric substrate, and a ground metal layer (not shown) provided on a second surface of the dielectric substrate. The calibration circuit may include a calibration port 530, transmission traces 13, 13', power divider/combiners 550, and couplers 560. The power divider/combiners 550 may be configured as Wilkinson power divider/combiners, and the couplers 560 may be configured as directional couplers 560. The calibration circuit can be used to identify any undesired changes in the amplitude and/or phase of RF signals input to different radio frequency ports 580 of the antenna.

In some embodiments, a remote radio may first input an RF signal to a corresponding radio frequency port 580 via the coaxial cables 20, 20'. Next, the calibration circuit may extract a small amount of the corresponding RF signals from the radio frequency port 580 by the coupler 560 and then combine the extracted signals into a calibration signal through the power combiner 550 and transfer the calibration signal back to the remote radio that generates the RF signals via the coaxial cables 20, 20'. The remote radio can adjust the amplitude and/or phase of the RF signals to be input on the radio frequency port 580 according to the calibration signals so as to provide optimized antenna beams. It should be understood that the calibration board 500 and the calibration circuit may include any suitable structure and/or working mode, and are not limited to the embodiments described above.

In order to input each RF signal to the corresponding radio frequency port 580 via the corresponding coaxial cables 20, 20', a plurality of openings 15, 15' may be provided on the calibration board, for example, in the middle area of the calibration board, and each of the openings 15, 15' may be configured to receive the corresponding coaxial cables 20, 20'. The end portion of each of the coaxial cables 20, 20' may extend to the calibration board substantially parallel to the calibration board. In this way, a compact calibration board— coaxial cable assembly is achieved. FIG. 11 shows the connection assembly 100 structured according to the first embodiment, and for the specific assembly structure, reference may be made to the detailed description above. FIG. 12 shows the connection assembly 100' structured according to the second embodiment, and for the specific assembly structure, reference may be made to the detailed description above.

Next, with reference to FIGS. 13 to 22, specific design schemes of the connection assembly 100" according to additional embodiments of the present disclosure will be described in detail.

Figure 14:
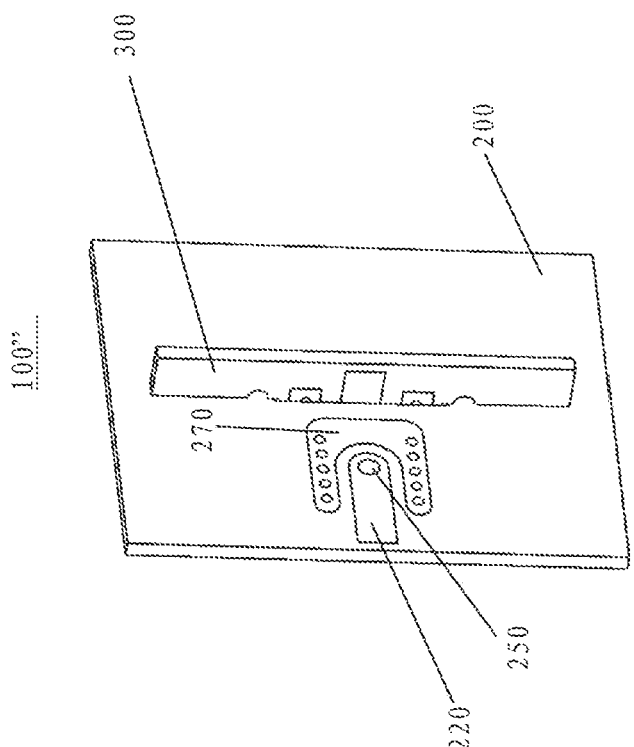
FIG. 14 schematically shows a partial front, left-side perspective view of the upper half of a connection assembly 100″.
Figure 13:
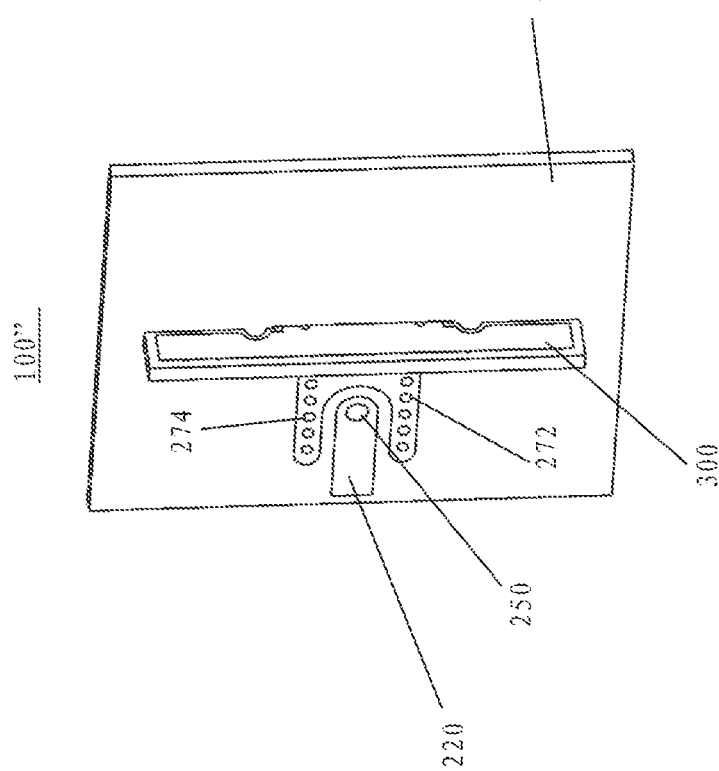
FIG. 13 schematically shows a partial front, right-side perspective view of the upper half of a connection assembly 100″.
Figure 16:
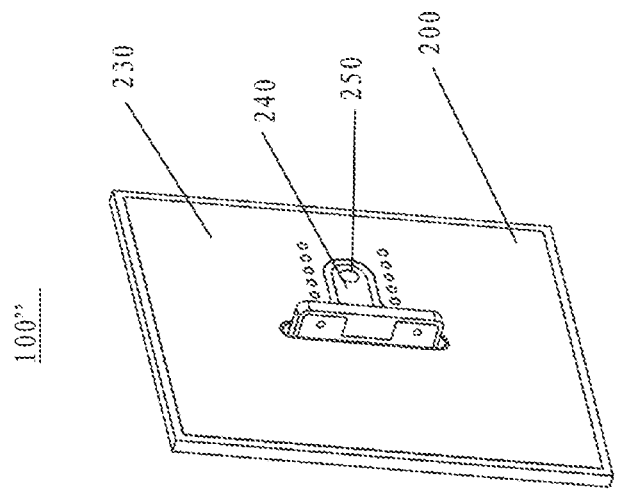
FIG. 16 schematically shows a partial back, left-side perspective view of the lower half of a connection assembly 100″.
Figure 15:
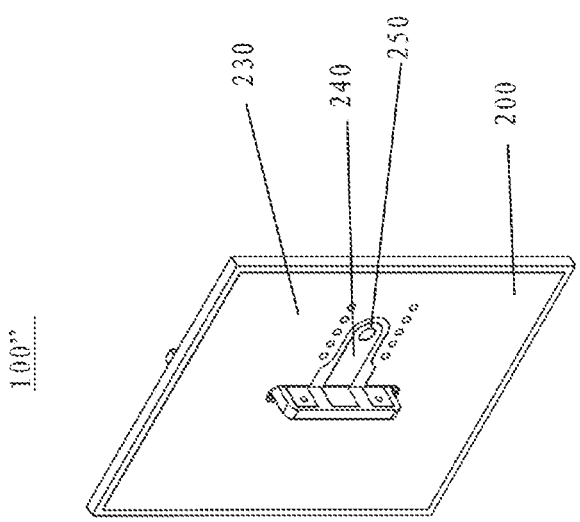
FIG. 15 schematically shows a partial back, right-side perspective view of the lower half of a connection assembly 100″.
Figure 18:
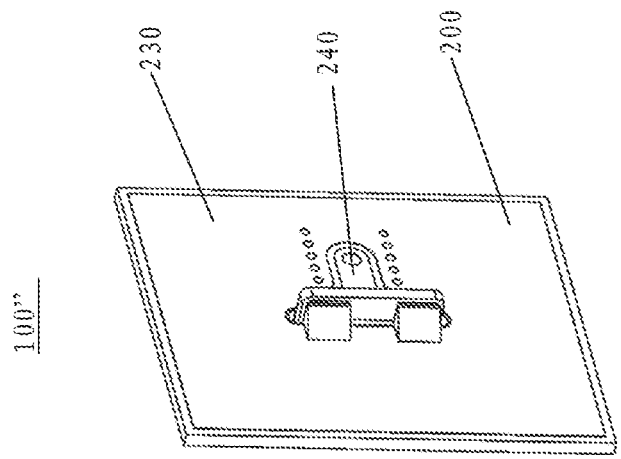
FIG. 18 schematically shows a partial perspective view of FIG. 16 in a soldered state.
Figure 17:
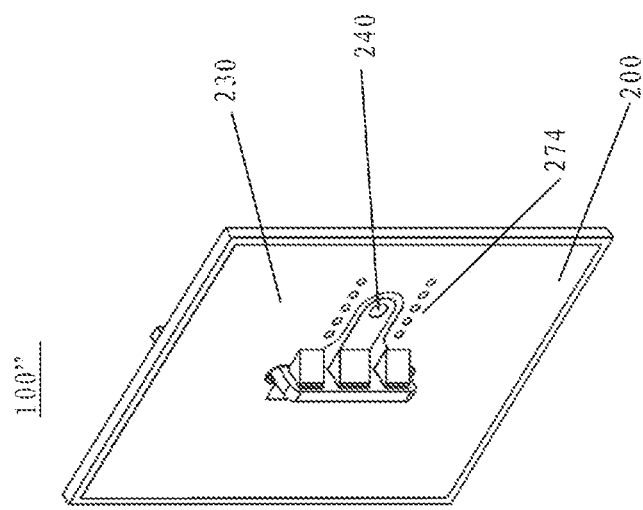
FIG. 17 schematically shows a partial perspective view of FIG. 15 in a soldered state.
Figure 20:
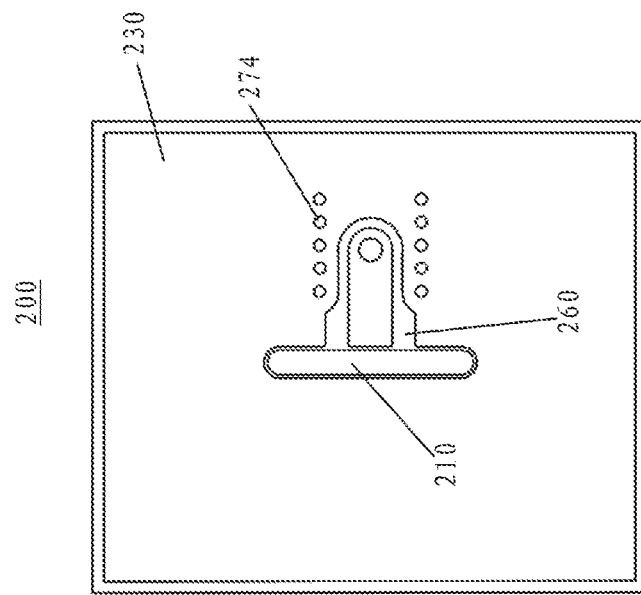
FIG. 20 shows a simplified schematic diagram of a second surface of a printed circuit board.
Figure 19:
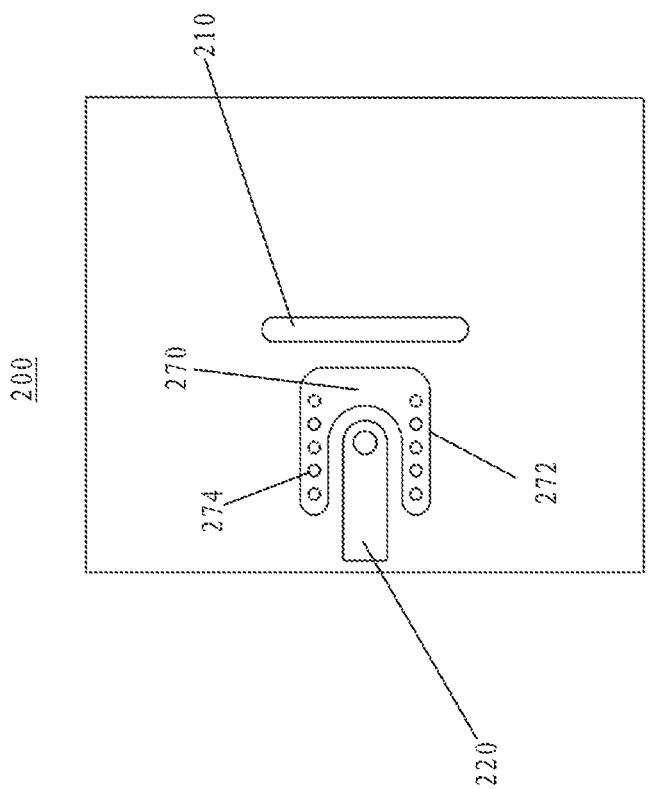
FIG. 19 schematically shows a simplified schematic diagram of a first surface of a printed circuit board.
Figure 22:
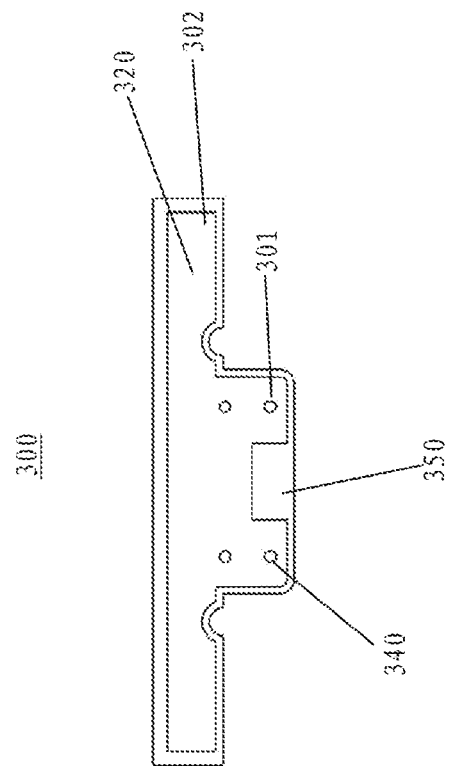
FIG. 22 shows a simplified schematic diagram of a second surface of a feed stalk.
Figure 21:
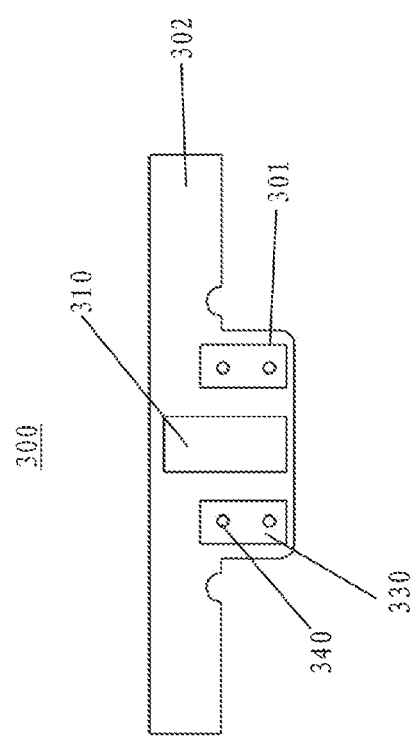
FIG. 21 shows a simplified schematic diagram of a first surface of a feed stalk.

FIG. 13 schematically shows a partial front, right-side perspective view of the upper half of a connection assembly 100". FIG. 14 schematically shows a partial front, left-side perspective view of the upper half of a connection assembly 100". FIG. 15 schematically shows a partial back, right-side perspective view of the lower half of a connection assembly 100". FIG. 16 schematically shows a partial back, left-side perspective view of the lower half of a connection assembly 100". FIG. 17 schematically shows a partial perspective view of FIG. 15 in a soldered state. FIG. 18 schematically shows a partial perspective view of FIG. 16 in a soldered state. FIG. 19 shows a simplified schematic diagram of a first surface of a printed circuit board. FIG. 20 shows a simplified schematic diagram of a second surface of a printed circuit board. FIG. 21 shows a simplified schematic diagram of a first surface of a radiating element 300. FIG. 22 shows a simplified schematic diagram of a second surface of a radiating element 300.

The connection assembly 100" may include a printed circuit board 200 (which may also be referred to herein as a feeder panel) and a radiating element 300 that is connected to the printed circuit board 200 and extends forwardly therefrom. The radiating element 300 may include a feed stalk 301 and a radiator 302 mounted on the feed stalk 301, and the radiating element 300 may be mounted on the printed circuit board 200 through the feed stalk 301. It should be understood that the radiator 302, as a device that transmits and receives radio frequency signals, is generally mounted on an end of the feed stalk 301 forwardly of the feeder panel 200. Generally, the radiator 302 may be a pair of dipoles that are configured to transmit and receive radio frequency signals at orthogonal polarizations. In some embodiments, the radiator 302 may be a printed radiator that is implemented as a metal pattern that is printed on the printed circuit board. In some embodiments, the radiator 302 may be a sheet metal radiator. No restrictions are made on the radiator here.

Radio frequency transition performance between the feeder panel 200 and the feed stalk 301 of the radiating element 300 may affect radio frequency performance, for example, return loss, insertion loss and isolation of an antenna. As base station antennas are designed to support service in higher operating frequency bands, for example, operating frequency bands within the 3-6 GHz frequency range, the performance of the radio frequency transition becomes increasingly important. It is desirable to maintain stable and smooth transition during transmission of radio frequency signals from the feeder panel 200 to the feed stalk 301.

As shown in FIGS. 13 to 16, the feed stalk 301 may be basically mounted perpendicularly to the printed circuit board 200. An opening 210 (refer to FIGS. 19-20) is provided in the printed circuit board 200 that may receive a rear portion of the feed stalk 301. The feed stalk 301 of the radiating element 300 may extend through the opening 210 so that the feed stalk 301 protrude rearwardly from a second (back) surface of the printed circuit board 200. In order to realize effective transition of radio frequency signals, a feed line 310 (refer to FIG. 21) on the feed stalk 301 may be electrically connected to a transmission trace 220 on the printed circuit board 200 through soldering. A ground wire 330 (refer to FIG. 21) on the feed stalk 301 may be electrically connected to a ground metal layer 230 on the printed circuit board 200 through soldering.

As shown in FIGS. 19 and 20, a first (front) surface of the printed circuit board 200 is provided with the transmission trace 220, where the transmission trace 220 is configured to feed RF signals to the feed stalk 301 of the radiating element 300, thereby feeding the signals to the radiator 302. It should be understood that the transmission trace 220 shown in the figures is merely an exemplary and schematic form and may have various forms of directions and shapes.

For the purpose of electrical connection, for example, soldering to the transmission trace 220, a soldering area 240 (refer to FIGS. 17-18) for electrically connection to the transmission trace 220 may be provided on the printed circuit board 200. Usually, for the purpose of realizing efficient and reliable soldering, backside automated soldering procedures must be adopted. Therefore, the soldering area 240 may be set on the second (back) surface of the printed circuit board 200, and the soldering area 240 may be electrically connected to the transmission trace 220 through a via hole 250 (refer to FIGS. 13-14). In other embodiments, for example, if backside automated soldering procedures do not need to be adopted, the soldering area 240 may also be set on the first surface of the printed circuit board 200.

As shown in FIGS. 17, 18 and 20, the soldering area 240 may be set to abut the opening 210 for accommodating the radiating element 300, and the soldering area 240 may be set on one side of the feed stalk 301 that has a feed line 310. An isolation gap 260 may be provided around the soldering area 240 and metal in the isolation gap 260 may be removed such that the soldering area 240 is electrically isolated from the ground metal layer 230 on the second surface of the printed circuit board 200. The isolation gap 260 may extend in a closed-loop along the contour of the soldering area 240 and opening 210.

As shown in FIGS. 17 and 18, in a soldered state, the feed line 310 of the feed stalk 301 and the soldering area 240 on the printed circuit board 200 may be electrically connected to each other, the ground metal layer 230 of the feed stalk 301 and the ground metal layer 230 on the printed circuit board 200 may be electrically connected to each other through soldering, and the ground wire 330 of the feed stalk 301 and the ground metal layer 230 on the printed circuit board 200 may be electrically connected to each other through soldering.

In order to improve radio frequency transition between the feeder panel 200 and the feed stalk 301 of the radiating element 300, the connection assembly 100" may further include a ground structure 270, which may be printed on the first (front) surface of the printed circuit board 200 and be electrically connected to the ground metal layer 230 on the second (rear) surface of the printed circuit board 200. The ground structure 270 may at least be partially arranged on two ends of the transmission trace 220 and the ground structure 270 shall form a coplanar waveguide structure with the transmission trace 220. The ground structure 270 is capable of at least partially reducing undesirable radiation to the surrounding environment when radio frequency signals are transmitted from the feeder panel 200 to the feed stalk 301. Therefore, the ground structure 270 is capable of ensuring smoother transition when RF signals are transmitted from the feeder panel 200 to the feed stalk 301, further reducing return loss and spatial radiation loss.

The ground structure 270 may include a metallic pattern area 272 set on the first surface of the printed circuit board 200. The metallic pattern area 272 may be electrically connected to the ground metal layer 230 set on the second surface of the printed circuit board 200 through a series of via holes 274. As shown in FIGS. 19 and 20, the metallic pattern area 272 may form a U-shaped pattern structure to surround the transmission trace 220 on three sides At least two sides of the U-shaped pattern structure are connected to the ground metal layer 230 on the back side through a series of via holes 274. It should be understood that the direction, shape and length of the metallic pattern area 272 may be adjusted according to the actual application scenario, and shall not be restricted here.

As shown in FIGS. 21 and 22, the feed stalk 301 may be configured as a printed circuit board element, and the feed line 310 and two ground wires 330-1 and 330-2 may be provided on the first surface thereof—each ground wire is electrically connected to the ground metallic layer 230 on the second surface of the feed stalk 301 through via holes 340—the feed line 310 is located between two ground wires 330. The feed line 310 and the two ground wires 330-1 and 330-2 may form a coplanar waveguide structure, thereby improving the transmission process of RF signals from the feeder panel 200 to the feed stalk 301.

Continuing to refer to FIG. 22, a blank area 350 may be provided in the ground metallic layer 320 [sic: 230] on the second surface of the feed stalk 301, and metal in the blank area 350 is removed. An end of the feed line 310 near the printed circuit board 200 is located in a region corresponding to the blank area 350 on the first surface of the feed stalk 301. Favorably, the width of the blank area 350 may be larger than the width of the feed line 310, and the length of the blank area 350 may be larger or equivalent to the soldering area 240 of the feed line 310. The aforementioned design of the blank area is conducive to improvement of the transmission process of RF signals from the feeder panel 200 to the feed stalk 301, for example, improving return loss and other radio frequency performance.

Although some specific embodiments of the present disclosure have been described in detail by examples, those skilled in the art should understand that the above examples are only for illustration, not for limiting the scope of the present disclosure. The examples disclosed herein can be combined arbitrarily without departing from the spirit and scope of the present disclosure. Those skilled in the art should also understand that various modifications can be made to the examples without departing from the scope and spirit of the present disclosure. The scope of the present disclosure is defined by the Claims attached.

That which is claimed is:

1. A connection assembly for an antenna, the connection assembly including a printed circuit board and a coaxial cable that has an inner conductor and an outer conductor connected to the printed circuit board, wherein
    a transmission trace is provided on a first surface of the printed circuit board, and a solder pad for electrically connecting the transmission trace is provided on the printed circuit board;
    an opening extending completely through the printed circuit board, wherein an exposed portion of the outer conductor at least partially extends in the opening, and an exposed portion of the inner conductor is soldered to the solder pad and is electrically connected to the transmission trace;
    the connection assembly further includes a ground structure, which is electrically connected to a ground metal layer on a second surface of the printed circuit board, wherein the ground structure is at least partially arranged on both sides of the exposed inner conductor and/or the exposed outer conductor,
    wherein the inner conductor passes completely through the opening.

2. The connection assembly according to claim 1, wherein the ground structure includes a metal pattern area provided on the first surface of the printed circuit board, and the metal pattern area is electrically connected to the ground metal layer provided on the second surface of the printed circuit board via one or more via holes.

3. The connection assembly according to claim 1, wherein the exposed portion of the outer conductor is soldered to a ground pad that is electrically connected to the ground metal layer.

4. The connection assembly according to claim 2, wherein the metal pattern area extends around the opening in a strip shape.

5. The connection assembly according to claim 2, wherein the metal pattern area includes a first section arranged on both sides of the exposed portion of the inner conductor and a second section arranged on both sides of the exposed portion of the outer conductor.

6. The connection assembly according to claim 1, wherein the coaxial cable extends in the opening in an orientation at an angle of less than 20° with the printed circuit board.

7. The connection assembly according to claim 1, wherein the coaxial cable extends in the opening parallel to the printed circuit board.

8. The connection assembly according to claim 2, wherein the metal pattern area surrounds the opening on at least two sides.

9. The connection assembly according to claim 8, wherein the metal pattern area surrounds the opening on three sides.

10. The connection assembly according to claim 8, wherein the metal pattern area is electrically connected to the ground metal layer through a series of via holes arranged in accordance with the shape of the metal pattern area.

11. The connection assembly according to claim 1, wherein the exposed portion of the inner conductor, together with the ground structure arranged on both sides of the exposed portion of the inner conductor, forms a coplanar waveguide structure.

12. The connection assembly according to claim 1, wherein the ground structure extends along the entire length of the exposed portion of the inner conductor.

13. A connection assembly for an antenna, the connection assembly including a printed circuit board and a coaxial cable connected to the printed circuit board, wherein
    a transmission trace is provided on a first surface of the printed circuit board, and a solder pad for electrically connecting the transmission trace is provided on the printed circuit board;
    an opening for receiving an end portion of the coaxial cable is provided in the printed circuit board, wherein an exposed outer conductor of the end portion partially or completely extends in the opening, and an exposed inner conductor of the end portion that extends from the exposed outer conductor is soldered to the solder pad and is electrically connected to the transmission trace;
    the connection assembly further includes a ground structure, which is electrically connected to a ground metal layer on a second surface of the printed circuit board, wherein the ground structure is at least partially arranged on both sides of the exposed inner conductor and/or the exposed outer conductor,
    wherein an impedance matching portion is provided on the first surface and/or the second surface of the printed circuit board, and the impedance matching portion is electrically connected to the solder pad.

14. The connection assembly according to claim 13, wherein the ground structure is arranged on both sides of the solder pad and/or the impedance matching portion.

15. A connection assembly for an antenna, the connection assembly including a printed circuit board and a coaxial cable connected to the printed circuit board, wherein
    a transmission trace is provided on a first surface of the printed circuit board, and a solder pad for electrically connecting the transmission trace is provided on the printed circuit board;
    an opening for receiving an end portion of the coaxial cable is provided in the printed circuit board, wherein an exposed outer conductor of the end portion partially or completely extends in the opening, and an exposed inner conductor of the end portion that extends from the exposed outer conductor is soldered to the solder pad and is electrically connected to the transmission trace;

the connection assembly further includes a ground structure, which is electrically connected to a ground metal layer on a second surface of the printed circuit board, wherein the ground structure is at least partially arranged on both sides of the exposed inner conductor and/or the exposed outer conductor, wherein the ground structure includes a metal pattern area provided on the first surface of the printed circuit board, and the metal pattern area is electrically connected to the ground metal layer provided on the second surface of the printed circuit board via one or more via holes, wherein the ground structure further includes a ground connector, which is soldered to the metal pattern area to form the ground structure together with the metal pattern area.

16. The connection assembly according to claim 15, wherein the ground connector may include an outer conductor joint portion and a ground joint portion, the outer conductor joint portion is configured to be soldered to the exposed portion of the outer conductor, the ground joint portion is configured to be soldered to the metal pattern area.

17. The connection assembly according to claim 16, wherein a first part of the ground joint portion is soldered to the metal pattern area on the first surface of the printed circuit board, and a second part of the ground joint portion is soldered to the ground pad electrically connected to the ground metal layer on the second surface of the printed circuit board.

18. The connection assembly according to claim 16, wherein the ground connector is configured as a ground clip, the outer conductor joint portion of the ground clip is configured as a hollow tubular portion, which sleeves the exposed outer conductor and is soldered to the exposed outer conductor, the ground joint portion of the ground clip has a first side wall and a second side wall which are respectively arranged on one side of the exposed inner conductor.

19. The connection assembly according to claim 15, wherein the ground connector is arranged on both sides of the exposed portion of the inner conductor, and the metal pattern area is arranged on both sides of the exposed portion of the outer conductor.

20. The connection assembly according to claim 15, wherein the ground connector and the metal pattern area form a conducting loop.

* * * * *